United States Patent
Jeong et al.

(10) Patent No.: US 7,516,384 B2
(45) Date of Patent: Apr. 7, 2009

(54) SEMICONDUCTOR MEMORY TESTING DEVICE AND TEST METHOD USING THE SAME

(75) Inventors: Tae-Jin Jeong, Seoul (KR); Sang-Woong Shin, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 295 days.

(21) Appl. No.: 11/336,331

(22) Filed: Jan. 20, 2006

(65) Prior Publication Data
US 2006/0163572 A1 Jul. 27, 2006

(30) Foreign Application Priority Data
Jan. 24, 2005 (KR) ............ 10-2005-0006297

(51) Int. Cl.
*G01R 31/28* (2006.01)
(52) U.S. Cl. ............... 714/744; 714/718; 714/738; 324/765; 365/201
(58) Field of Classification Search .............. 714/744
See application file for complete search history.

(56) References Cited

U.S. PATENT DOCUMENTS

| | | | |
|---|---|---|---|
| 6,400,625 B2 * | 6/2002 | Arimoto et al. ............ 365/201 |
| 6,456,561 B2 | 9/2002 | Maeda | |
| 6,868,707 B2 * | 3/2005 | Nishi et al. ................ 72/11.9 |
| 6,880,117 B2 * | 4/2005 | Lin et al. ................... 714/718 |
| 7,404,116 B2 * | 7/2008 | Wang ........................ 714/718 |
| 2002/0157052 A1 * | 10/2002 | Ernst et al. ................ 714/738 |
| 2003/0031082 A1 * | 2/2003 | Sawada ..................... 365/233 |
| 2003/0070118 A1 * | 4/2003 | Nakao et al. ............... 714/30 |

(Continued)

FOREIGN PATENT DOCUMENTS

JP 05-180906 7/1993

(Continued)

OTHER PUBLICATIONS

English language abstract of Japanese Publication No. 05-180906.

(Continued)

*Primary Examiner*—Cynthia Britt
*Assistant Examiner*—Steven D Radosevich
(74) *Attorney, Agent, or Firm*—Marger Johnson & McCollom, P.C.

(57) ABSTRACT

A test device for a semiconductor memory device includes a clock frequency multiplier, a data input buffer, a test data generator and a data output buffer. The clock frequency multiplier multiplies an external clock signal having a relatively low frequency provided from an external test device to generate an internal clock signal having a relatively high frequency. The data input buffer buffers test pattern data provided in synchronization to the external clock signal to output the buffered test pattern data. The test data generator generates test data that is to be synchronized to the internal clock signal, using the outputted test pattern data based on a first or a second control signal. The data output buffer outputs the generated test data to a memory core of the semiconductor memory device. The test device generates various test data suitable for a memory test at a high operating speed.

32 Claims, 8 Drawing Sheets

U.S. PATENT DOCUMENTS

| | | | |
|---|---|---|---|
| 2003/0233604 A1* | 12/2003 | Lin et al. | 714/718 |
| 2004/0061560 A1* | 4/2004 | Kwon et al. | 331/53 |
| 2004/0100839 A1* | 5/2004 | Kim et al. | 365/201 |
| 2004/0139376 A1* | 7/2004 | Ohta et al. | 714/724 |
| 2004/0205437 A1* | 10/2004 | Yao et al. | 714/742 |
| 2004/0239310 A1* | 12/2004 | Oshima et al. | 324/158.1 |

FOREIGN PATENT DOCUMENTS

| | | |
|---|---|---|
| JP | 11-306797 | 11/1999 |
| JP | 2003-059298 | 2/2003 |

OTHER PUBLICATIONS

English language abstract of Japanese Publication No. 11-306797.
English language abstract of Japan Publication No. 2003-059298.

* cited by examiner

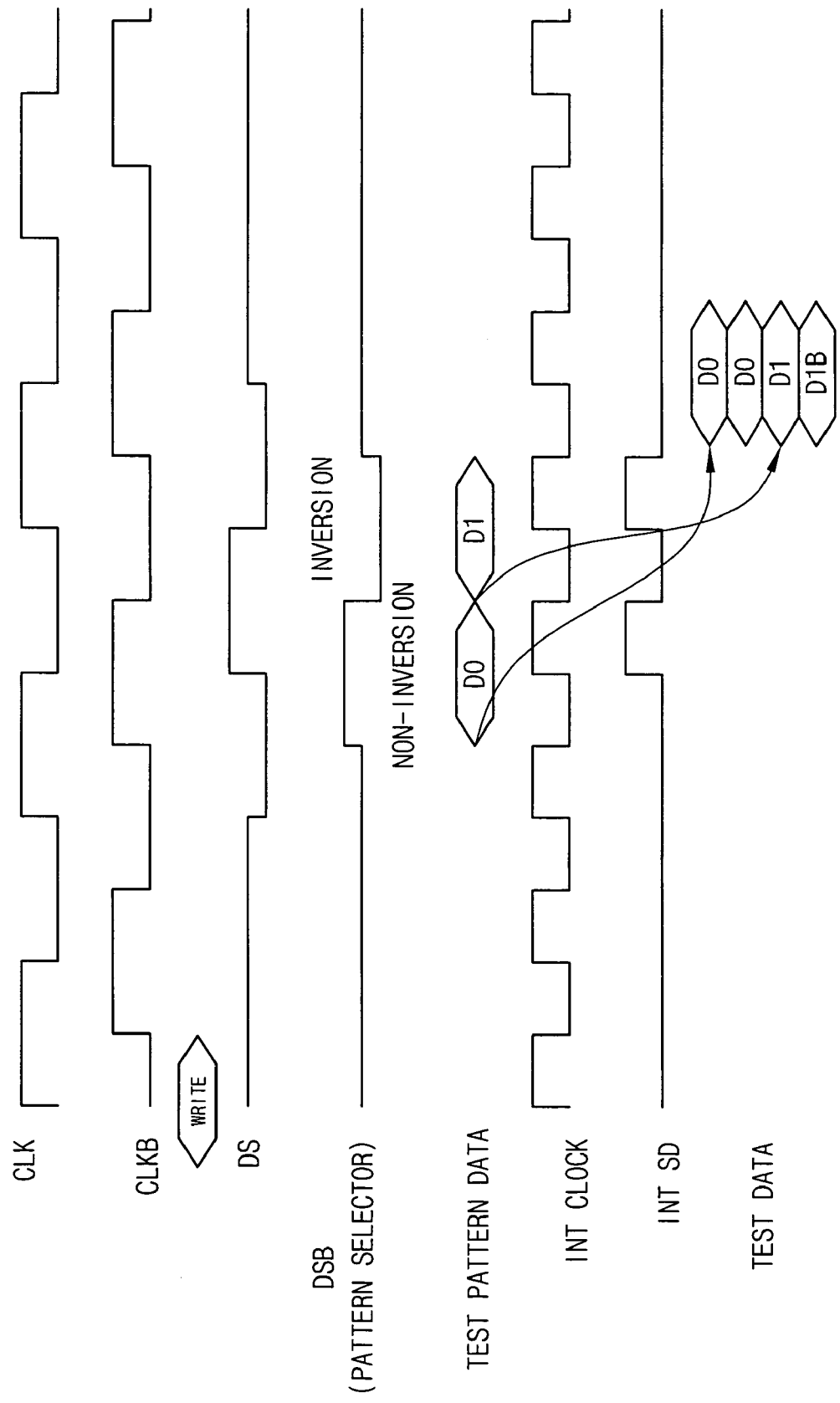

SEMICONDUCTOR MEMORY TESTING DEVICE AND TEST METHOD USING THE SAME

CROSS REFERENCE TO RELATED APPLICATIONS

This application claims priority from Korean Patent Application No. 10-2005-0006297 filed on 24 Jan. 2005 in the Korean Intellectual Property Office. Korean Patent Application No. 10-2005-0006297 is incorporated by reference in its entirety.

BACKGROUND

1. Technical Field

This disclosure relates to a semiconductor memory test device and a test method using the same, and more particularly to semiconductor memory test devices that are capable of performing a high-speed memory test using various test data, and test methods using the same.

2. Description of the Related Art

Generally, a memory device is used to temporarily or permanently storing data and/or commands for computers, communication systems, image processing systems and so on. Examples of the memory device include semiconductor memory devices, tapes, magnetic disks and optical disks. Currently, the semiconductor memory device is the predominant memory device.

According to a data storage method, the semiconductor memory device is categorized into a dynamic random access memory (DRAM), a static random access memory (SRAM), a flash memory, and a read only memory (ROM). The storage capacities and operating speeds of these semiconductor memory devices are rapidly increasing.

Typically, in order to produce the semiconductor memory device, a circuit design process, a manufacturing process, and a test process are sequentially performed. The test process determines an increase or decrease in product reliability. In order to perform the test process on the semiconductor memory device, a predetermined test pattern is written to a cell of the semiconductor memory device, and then, the cell where the predetermined test pattern is written is read. By comparing the written test pattern with the read test pattern, the cell of the semiconductor memory device may be categorized as a defective cell or a non-defective cell.

An external test device inputs an external clock signal to the semiconductor memory device, receives the read test pattern from the semiconductor memory device, and determines whether the corresponding cell of the semiconductor memory device is defective or non-defective.

In order for the external test device to exactly determine whether data errors are being received from the semiconductor memory device, a clock frequency of the semiconductor memory device should be identical to a clock frequency of the external test device. The clock frequencies of semiconductor memory devices are typically much larger (faster) than the clock frequencies of the external test devices.

In particular, since there is a rapidly increasing trend for high-speed memory products that exceed 500 MHz in clock frequency, and because manufacturing costs for the external test device are high, it is difficult to efficiently maintain the affordability of external test devices that have a clock frequency that can match that of the high-speed semiconductor memory devices.

For example, if the maximum clock frequency of the external test device is about 250 MHz and the maximum clock frequency of the semiconductor memory device is about 500 MHz, it is a common practice to downwardly adjust the clock frequency of the semiconductor memory device to match the clock frequency of the external test device during the test process.

In order to efficiently raise the clock frequency of the external test device without having to replace the external test device, a clock doubling test mode has been proposed. The clock doubling test mode enables the semiconductor memory device to be internally tested with a high frequency clock by multiplying the external clock provided from the external test device using an exclusive-OR operation or a phase-locked loop (PLL) circuit.

FIG. 1 is a timing diagram illustrating a conventional process of frequency multiplication during a clock doubling test mode. Referring to FIG. 1, an external clock signal CLK and an inverted clock signal CLKB are provided as inputs of the exclusive-OR operation during the clock doubling test mode. The inverted clock signal CLKB has a phase difference of about 90 degrees with respect to the external clock signal CLK.

An internal clock signal INTERNAL CLOCK is generated by performing the exclusive-OR operation, and an operating frequency of the internal clock signal INTERNAL CLOCK is two times greater than that of the external clock signal CLK. Alternatively, the PLL circuit may be used so that the operating frequency of the external clock signal CLK is multiplied.

Although the clock doubling test mode may raise the operating frequency by multiplying the external clock signal CLK, the clock doubling test mode may not raise a bit-rate on a data input.

FIG. 2 is a timing diagram illustrating a conventional process of test data generation during a clock doubling test mode.

Referring to FIG. 2, the frequency of an internal clock signal INT CLOCK is two times greater than that of an external clock signal CLK. However, test pattern data D0 and D1 exist during both a rising edge and a falling edge of a data strobe (DS) signal, which is synchronized to the external clock signal CLK. Thus, in view of the internal clock signal INT CLOCK, it may regarded that the test pattern data D0 and D1 exist only during a rising edge of the internal clock signal INT CLOCK.

The inputted test pattern data are generated as test data D0, D0, D1 and D1. That is, the first and second test data are identical to each other, and the third and fourth test data are identical to each other.

In the conventional method, although the clock frequency of the internal clock signal may be increased, it is not possible to generate various test data used for performing the test of the semiconductor memory device. As a result, it is difficult to effectively utilize the advantage of a high-rate operating frequency of the internal clock signal.

Embodiments of the invention address these and other disadvantages.

SUMMARY

Accordingly, embodiments of the invention may substantially obviate one or more of the disadvantages of the related art.

For example, according to some embodiments, a test device is capable of generating various test data patterns so as to perform a high-speed memory test using a low-speed memory test device.

According to other embodiments, a method of testing a semiconductor memory device includes using a test device included in the semiconductor memory device.

BRIEF DESCRIPTION OF THE DRAWINGS

The above and other features and advantages of the invention will become more apparent when described in detailed example embodiments thereof with reference to the attached drawings in which:

FIG. 8 is a timing diagram illustrating a method of generating test data according to some other embodiments of the invention, using the inverted signal DSB of the data strobe signal DS as the control signal according to the second example embodiment of the present invention.

DETAILED DESCRIPTION

Figure 1:
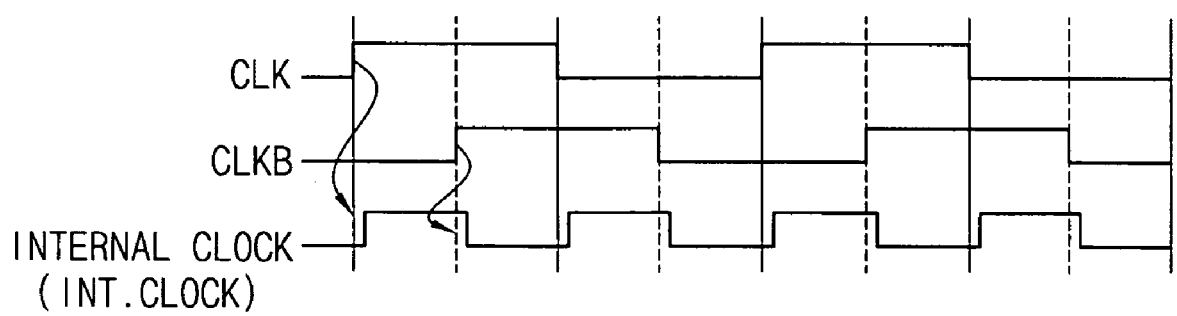
FIG. 1 is a timing diagram illustrating a conventional process of frequency multiplication during a clock doubling test mode.
Figure 2:
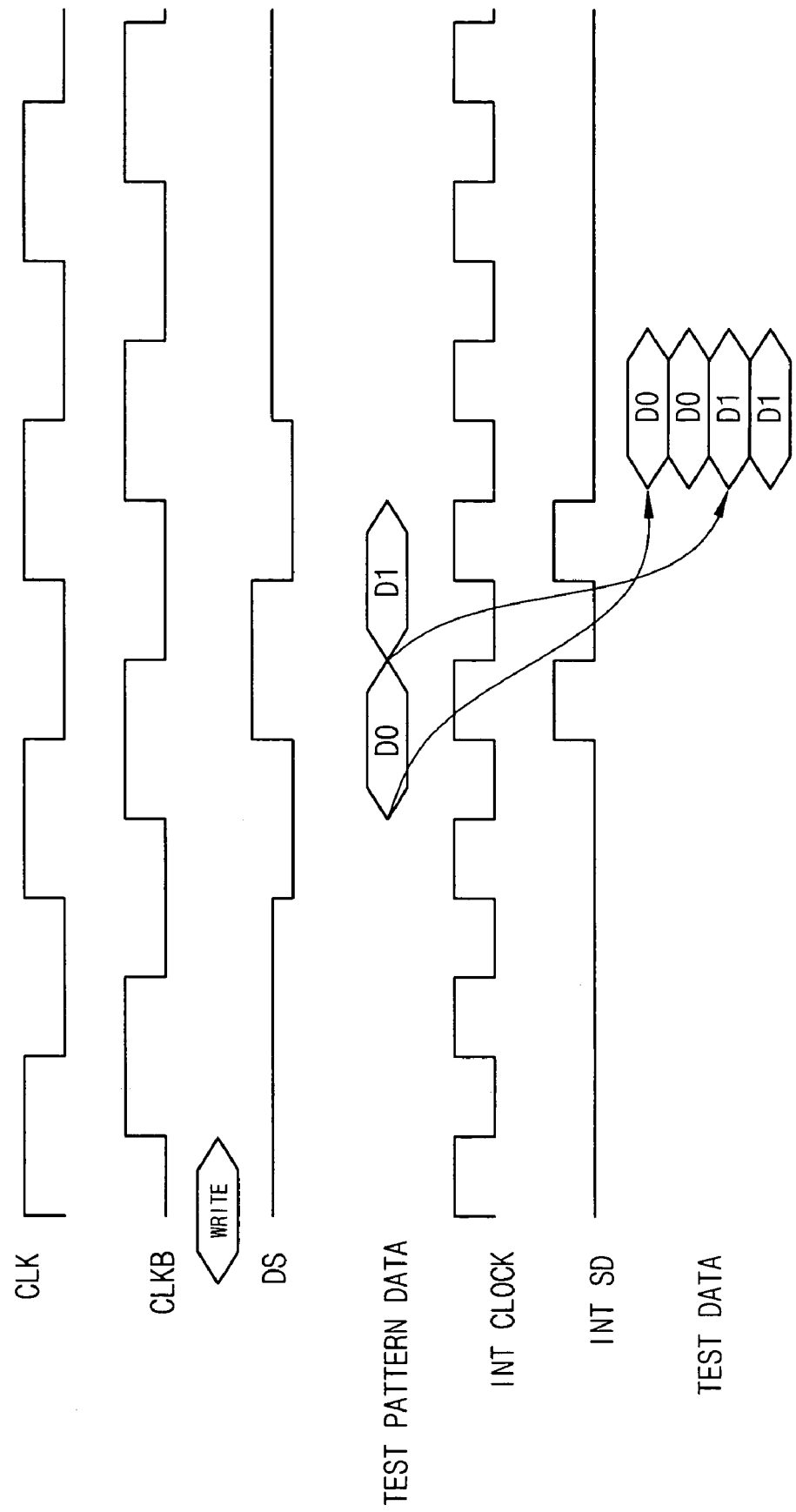
FIG. 2 is a timing diagram illustrating a conventional process of test data generation during a clock doubling test mode.

Detailed illustrative embodiments of the invention are disclosed below. Specific structural and functional details disclosed herein are merely representative for purposes of describing exemplary embodiments of the invention. The invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although terms such as first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
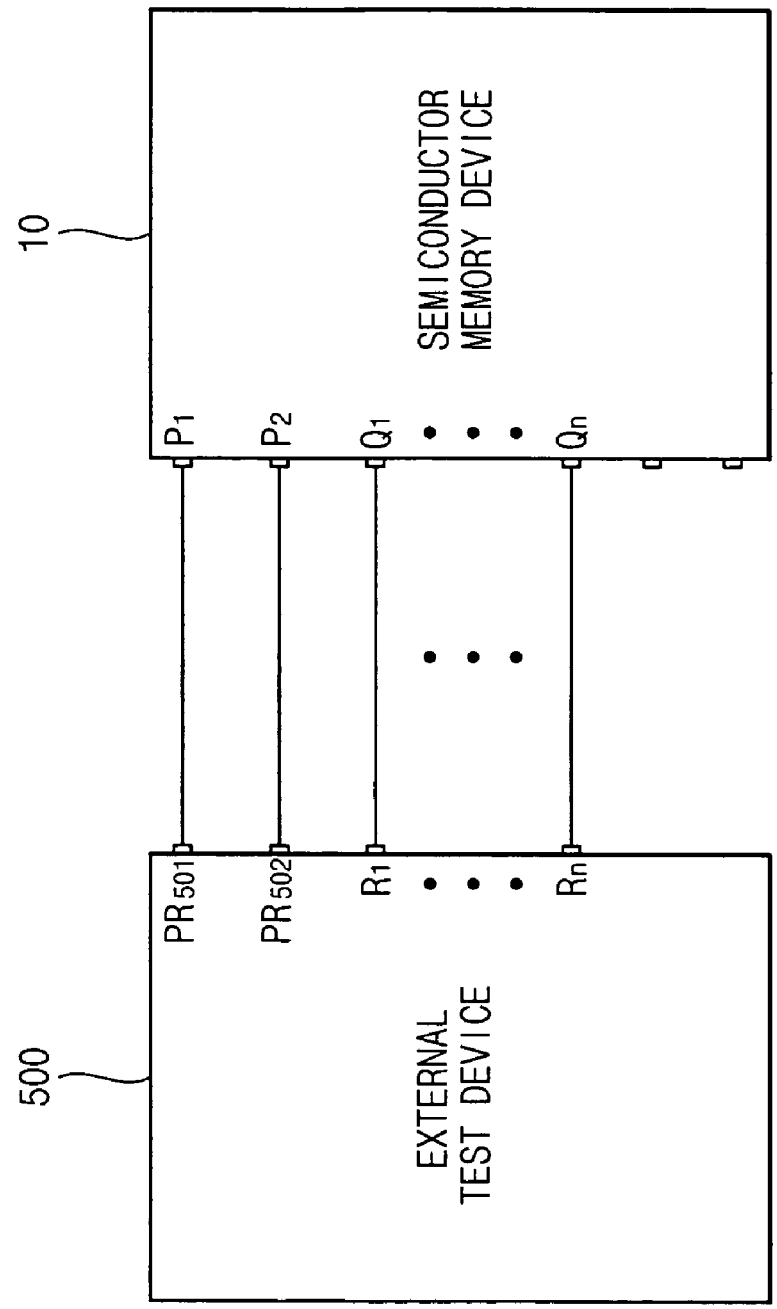
FIG. 3 is a block diagram illustrating a relationship between an external test device and a semiconductor memory device according to some embodiments of the invention.

FIG. 3 is a block diagram illustrating a relationship between an external test device and a semiconductor memory device according to some embodiments of the invention.

Referring to FIG. 3, a semiconductor memory device 10 includes a clock input pin $P_1$ coupled to a clock output pin $PR_{501}$ of an external test device 500, and a data input pin $P_2$ coupled to a data output pin $PR_{502}$ of the external test device 500.

The semiconductor memory device 10 includes a plurality of data input pins $Q_1$ through $Q_n$ that are coupled to a plurality of data output pins $R_1$ through $R_n$ that are included in the external test device 500.

A clock frequency of the external test device 500 is less than that of the semiconductor memory device 10. Thus, the external test device 500 operates at a slower speed than that of the semiconductor memory device 10.

In order to compensate for the relative operating speed difference between the external test device 500 and the semiconductor memory device 10, a clock doubling test mode may be employed.

A clock doubling test mode enable signal for activating the clock doubling test mode and an external clock signal may be provided to the semiconductor memory device 10 through the clock input pin $P_1$. The external clock signal has a relatively low frequency.

The external test device 500 provides the external clock signal and test pattern data to the semiconductor memory device 10.

The semiconductor memory device 10 writes the test pattern data received from the external test device 500 during the clock doubling test mode. The memory device 10 then reads the written test pattern data and transfers the read test pattern data to the external test device 500.

Figure 4:
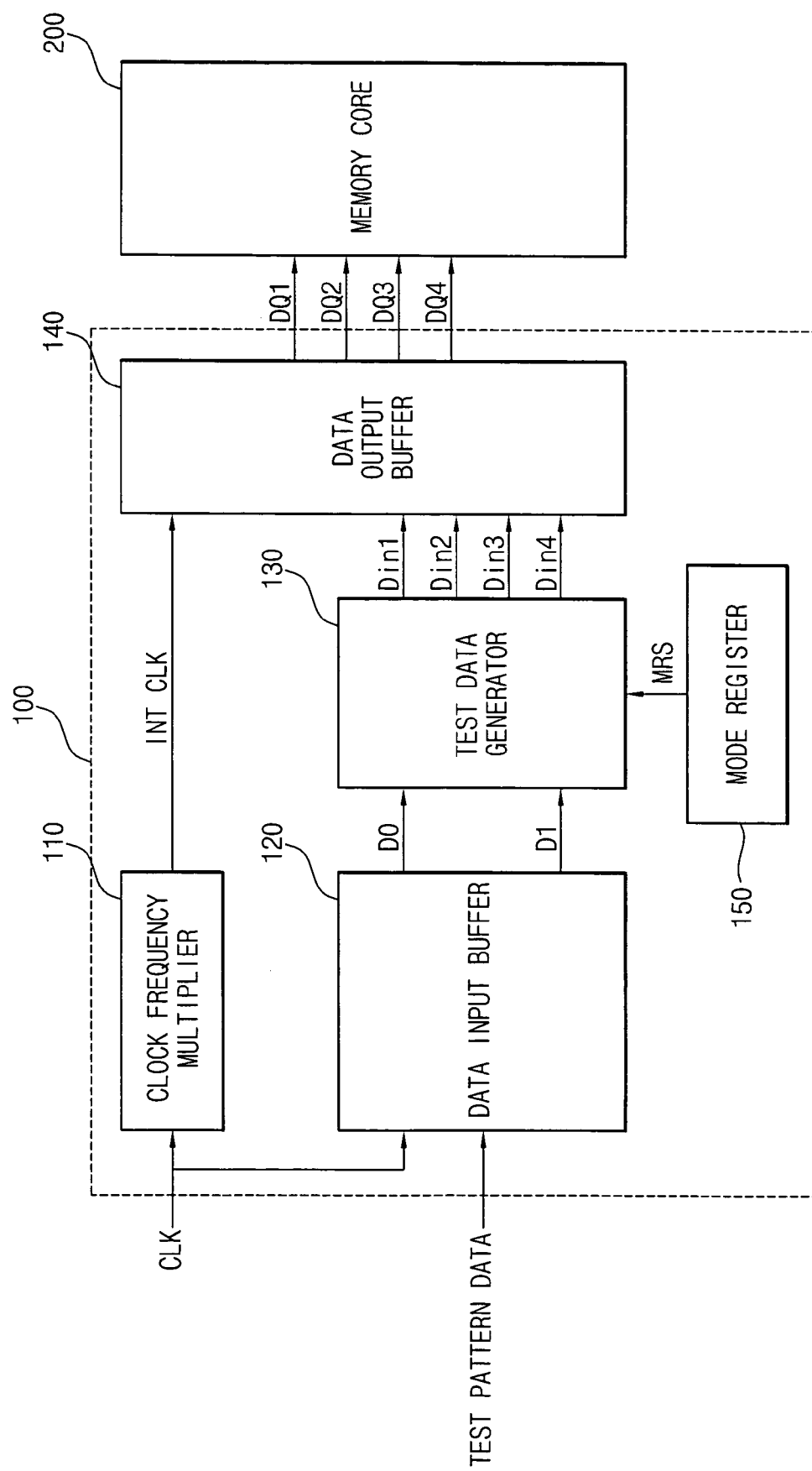
FIG. 4 is a block diagram illustrating a test device that may be included in the semiconductor memory device of FIG. 3 according to some embodiments of the invention.

FIG. 4 is a block diagram illustrating a test device that may be included in the semiconductor memory device 10 of FIG. 3 according to some embodiments of the invention.

Referring to FIG. 4, the test device 100 includes a clock frequency multiplier 110, a mode register 150, a data input buffer 120, a test data generator 130, and a data output buffer 140.

The clock frequency multiplier 110 multiplies a relatively low frequency external clock signal received from the external test device 500 to generate an internal clock signal with a relatively high frequency.

The clock frequency multiplier 110 generates an inverted external clock signal having a phase difference of about 90 degrees with respect to the external clock signal, and performs an exclusive-OR (X-OR) operation on the external clock signal and the inverted external clock signal to generate the internal clock signal. In the illustrated embodiments, the internal clock signal has a frequency that is about two times greater than that of the external clock signal.

In alternative embodiments of the invention, an internal clock signal having a frequency that is about two times greater than the external clock signal may be generated by employing a phase-locked loop (PLL) circuit that is capable of multiplying a reference signal.

The data input buffer 120 is capable of receiving the test pattern data from the external test device 500, buffering the test pattern data, and transferring the buffered test pattern data to the test data generator 130.

One of the test pattern data may be input to the test data generator 130 at each rising edge and at each falling edge of a data strobe (DS) signal, where the DS signal is synchronized to the external clock signal. That is, during one cycle of the external clock signal, two test pattern data D0 and D1 may be transferred to the test data generator 130.

The mode register 150 may store internal setting data for performing a memory test, and may provide an MRS (Mode Register Set) signal to the test data generator 130 during the memory test.

The test data generator 130 may receive the test pattern data D0 and D1 from the data input buffer 120, and may generate test data Din1, Din2, Din3, and Din4. The test data Din1, Din2, Din3, and Din4 may be synchronized to the internal clock signal in response to the MRS signal that is received from the mode register 150.

The data output buffer 140 synchronizes the test data Din1, Din2, Din3 and Din4 from the test data generator 130 to the internal clock signal to provide the synchronized test data DQ1, DQ2, DQ3 and DQ4 to the memory core 200. The synchronized test data DQ1, DQ2, DQ3, and DQ4 correspond to the output of the data output buffer 140 and may be written to the memory core 200.

According to other embodiments of the invention, the test data generator 130 may generate the test data Din1, Din2, Din3 and Din4 under the control of a predetermined control signal that is provided from an element other than the mode register 150.

Figure 5:
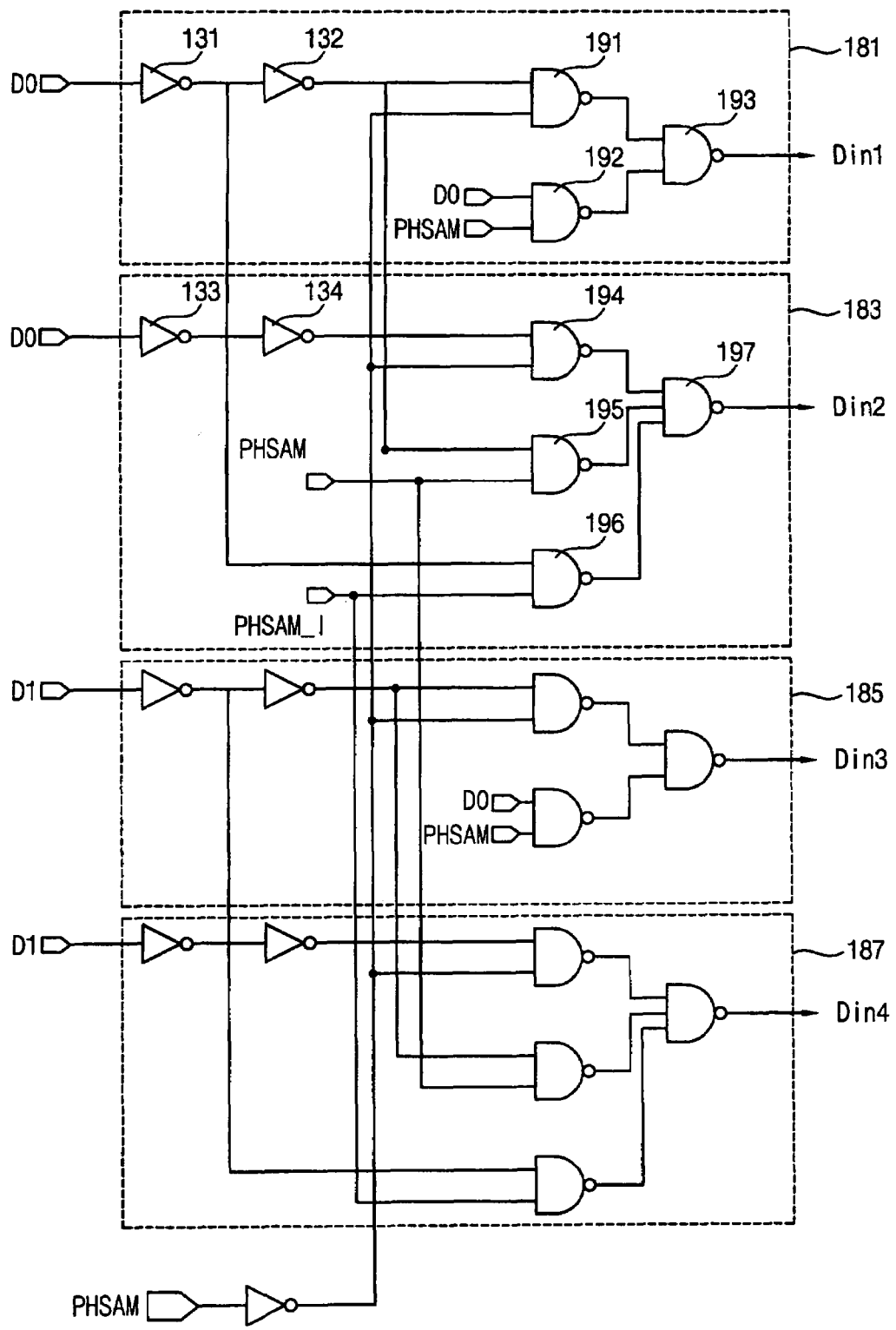
FIG. 5 is a circuit diagram further illustrating the test data generator of FIG. 4 according to some embodiments of the invention.

FIG. 5 is a circuit diagram further illustrating the test data generator 130 of FIG. 4 according to some embodiments of the invention, where the mode register set (MRS) signal is used as a control signal for generating test data.

Referring to FIG. 5, the test data generator 130 includes a first test data generator 181, a second test data generator 183, a third test data generator 185, and a fourth test data generator 187.

The first test data generator 181 receives the test pattern data D0 from the data input buffer 120, receives the mode register set enable signal PHSAM from the mode register 150, and outputs the test data Din1.

The second test data generator 183 receives the test pattern data D0 from the data input buffer 120, receives the mode register set enable signal PHSAM and receives a mode register set inversion signal PHSAM_I. The second test data generator 183 outputs the test data Din2.

The third test data generator 185 receives the test pattern data D1 from the data input buffer 120, receives the mode register set enable signal PHSAM, and outputs the test data Din3.

The fourth test data generator 187 receives the test pattern data D1 from the data input buffer 120, receives the mode register set enable signal PHSAM, receives the mode register set inversion signal PHSAM_I and outputs the test data Din4.

The first test data generator 181 includes a first inverter 131, a second inverter 132, a first NAND gate 191, a second NAND gate 192, and a third NAND gate 193. The first inverter 131 inverts the test pattern data D0. The second inverter 132 inverts an output of the first inverter 131. The first NAND gate 191 performs a NAND operation on an output of the second inverter 132 and an inverted version of the mode register set enable signal PHSAM. The second NAND gate 192 performs a NAND operation on the test pattern data D0 and the mode register set enable signal PHSAM. The third NAND gate 193 performs a NAND operation on an output of the first NAND gate 191 and an output of the second NAND gate 192 to output the test data Din1.

The second test data generator 183 includes a third inverter 133, a fourth inverter 134, a fourth NAND gate 194, a fifth NAND gate 195, a sixth NAND gate 196 and a seventh NAND gate 197. The third inverter 133 inverts the test pattern data D0. The fourth inverter 134 inverts an output of the third inverter 133. The fourth NAND gate 194 performs a NAND operation on an output of the fourth inverter 134 and the signal PHSAM'. The fifth NAND gate 195 performs a NAND operation on the output of the second inverter 132 and the mode register set enable signal PHSAM. The sixth NAND gate 196 performs a NAND operation on the output of the first inverter 131 and the mode register set inversion signal PHSAM_I. The seventh NAND gate 197 performs a NAND operation on an output of the fourth NAND gate 194, an output of the fifth NAND gate 195 and an output of the sixth NAND gate 196 to output the test data Din2.

The operations of the first test data generator 181 and the second test data generator 183 are explained in further detail below.

When the test pattern data D0 has a high logic level, the first inverter 131 outputs the test pattern data D0 at a low logic level, and the second inverter 132 outputs the test pattern data D0 at a high logic level. The first NAND gate 191 receives the test pattern data D0 from the second inverter 132 and the inverted version of the mode register set enable signal PHSAM at a low logic level. As a result, the output of the first NAND gate 191 is at a high logic level.

The second NAND gate 192 receives the test pattern data D0 and the mode register set enable signal PHSAM. As a result, the output of the second NAND gate 192 is at a low logic level.

The third NAND gate 193 receives the high logic level signal output from the first NAND gate 191 and the low logic level signal output from the second NAND gate 192 to output the test data Din1 having a high logic level that is identical to the logic level of the input test pattern data D0.

Meanwhile, the test data Din2 output from the second test data generator 183 is controlled as a non-inversion mode or as an inversion mode based on the mode register set enable signal PHSAM or the mode register set inversion signal PHSAM_I.

In order to generate the test data Din2 having an identical logic state to the logic state of the input D0, the mode register set enable signal PHSAM may be activated and the mode register set inversion signal PHSAM_I may be deactivated.

When the mode register set enable signal PHSAM is activated or asserted at a high logic level, the third inverter 133 included in the second test data generator 183 outputs the test pattern data D0 at a low logic level, and the fourth inverter 134 outputs the test pattern data D0 at a high logic level.

As a result, the fourth NAND gate 194 receives the test pattern data D0 and the inverted version of the mode register set enable signal PHSAM to output a high logic level signal.

The fifth NAND gate 195 receives the high logic level signal output from the second inverter 132 and the mode register set enable signal PHSAM having the high logic level to output a low logic level signal.

The sixth NAND gate 196 receives the low logic level signal output from the first inverter 131 and the mode register set inversion signal PHSAM_I having the low logic level to output a high logic level signal.

Accordingly, the seventh NAND gate 197 receives the high logic level signal output from the fourth NAND gate 194, the low logic level signal output from the fifth NAND gate 195, and the high logic level signal output from the sixth NAND gate 196 to output the test data Din2 having the high logic level.

That is, a logic state of the test data Din2 is identical to the logic state of the input test pattern data D0.

In order to generate the test data Din2 having a complementary logic state to the logic state of the input D0, the mode register set inversion signal PHSAM_I may be activated and the mode register set enable signal PHSAM may be deactivated.

When the mode register set inversion signal PHSAM _I is activated or asserted at a high logic level, the fourth NAND gate 194 outputs a high logic level signal, the fifth NAND gate 195 outputs a high logic level signal since the fifth NAND gate 195 receives the high logic level signal output from the second inverter 132 and the mode register set enable signal PHSAM at a low logic level, and the sixth NAND gate 196 outputs the high logic level signal since the sixth NAND gate 196 receives the low logic level signal output from the first inverter 131 and the mode register set inversion signal PHSAM _I at a high logic level.

Accordingly, the seventh NAND gate 197 receives the three high logic level signals output from the fourth, fifth and sixth NAND gates 194, 195 and 196 to output the test data Din2 having at a low logic level. That is, the logic state of the output test data Din2 is identical to D0', the complementary logic state of the input test pattern data D0.

As shown in FIG. 5, the third test data generator 185 and the fourth test data generator 187 have an identical circuit configuration compared to the first data generator 181 and the second test data generator 183, respectively. However, while the first test data generator 181 and the second test data generator 183 receive the test pattern data D0, the third test data generator 185 and the fourth test data generator 187 receive the test pattern data D1.

Thus, in a like manner as described above for the first test data generator 181 and the second test data generator 182, the output test data Din3 and Din4 may be generated as D1 and D1, or D1 and D1' by using the input test pattern data D1 and the mode register set enable signal PHSAM (non-inversion mode) or the mode register set inversion signal PHSAM_I (inversion mode), respectively.

During the non-inversion mode, the output Din1, Din2, Din3 and Din4 may be generated to the test data D0, D0, D1, D1 using the inputted test pattern data D0 and D1 based on the mode register set (MRS) signal, and during the inversion mode, the output Din1, Din2, Din3 and Din4 may be generated to the test data D0, D0', D1, D1'.

In the illustrated embodiments, the semiconductor memory device 10 generates the test data using the input test pattern data based on the mode register set (MRS) signal.

However, the input test pattern data D0 and D1 may be used to generate the test data D0, D0', D1, D1 and D0, D0, D1, D1' as well as the test data D0, D0, D1, D1 and D0, D0', D1, D1'.

According to other embodiments of the invention, the semiconductor memory device 10 may generate the test data D0, D0', D1, D1 and D0, D0, D1, D1' using the input test pattern data. According to these embodiments, as is explained below, the semiconductor memory device 10 is capable of improving test coverage by diversifying the test data.

In order to generate the four test data (D0, D0', D1, D1), (D0, D0, D1, D1'), (D0, D0, D1, D1) and (D0, D0', D1, D1'), a pattern selector capable of selecting the inversion mode or the non-inversion mode in a real time is used as a control signal.

The control signal may be applied to the test data generator 130 using a spare signal input pin of the semiconductor memory device 10 during the memory test time.

For example, a process for generating the test data may be performed in advance of a write operation of the semiconductor memory device 10, and the write operation performs CAS (Column Address Strobe) access. Thus, after selecting an unused pin among a plurality of pins used for input of a row address signal, the selected pin may be utilized for an input pin of the control signal.

Figure 6:
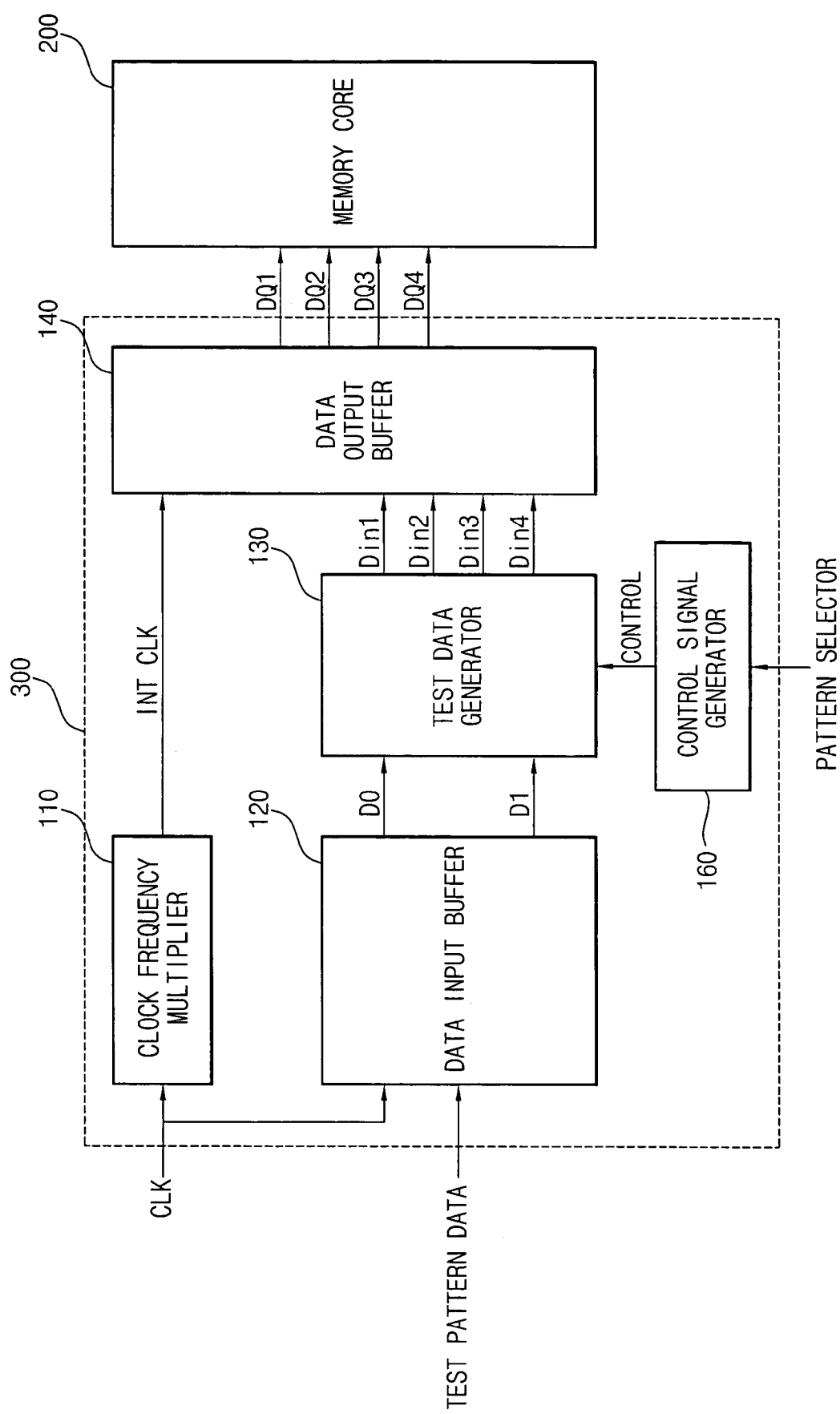
FIG. 6 is a block diagram illustrating a test device that may be included in the semiconductor memory device of FIG. 3 according to some other embodiments of the invention.

FIG. 6 is a block diagram illustrating a test device 300 that may be included in the semiconductor memory device 10 of FIG. 3 according to some other embodiments of the invention.

Referring to FIG. 6, the test device 300 includes a clock frequency multiplier 110, a data input buffer 120, a test data generator 130, and a data output buffer 140, and these elements are substantially identical to those of the test device 100 illustrated in FIG. 4. However, the test device 300 shown in FIG. 6 includes a control signal generator 160 instead of the mode register 150 shown in FIG. 4.

The control signal generator 160 provides an external control signal enable signal (CONTROL) to the test data generator 130, and generates an inversion control signal. The control signal enable signal includes a non-inversion mode based on an active level or an inversion mode based on a negative level of the control signal enable signal that is provided from the control signal input pin, such as the row address pin. The control signal generator 160 provides the control signal enable signal including the inversion mode or the non-inversion mode to the test data generator 130.

In the described embodiments of the invention, the active level of the CONTROL signal is set to the inversion mode and the negative level of the CONTROL signal is set to the non-inversion mode. Alternatively, the active level may be set to the non-inversion mode and the negative level may be set to the inversion mode.

Thus, FIG. 6 is different from FIG. 4 in that the external control signal enable signal and the inversion control signal, are provided to the test data generator 130 instead of the mode register set enable signal and the mode register set inversion signal.

Figure 7:
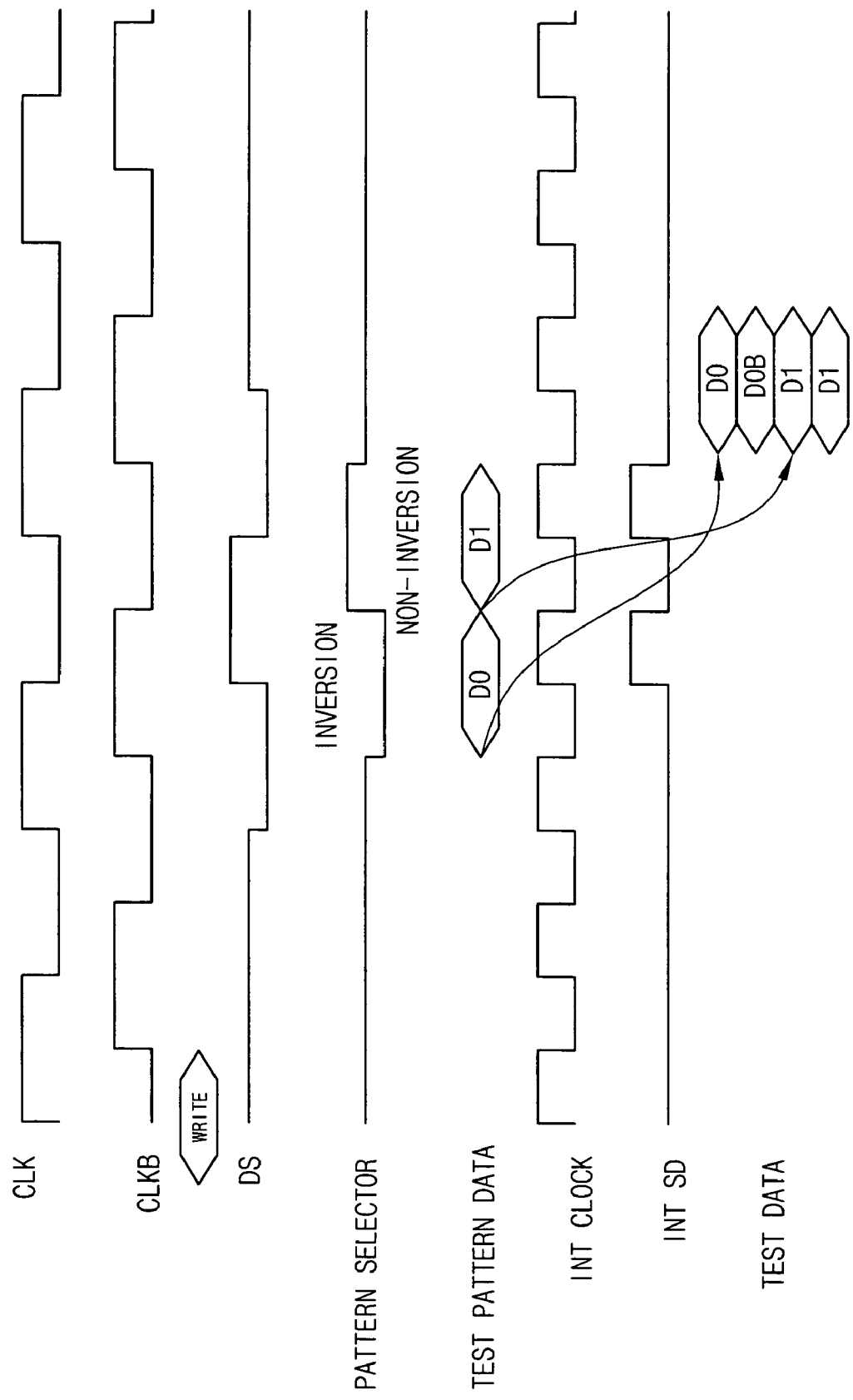
FIG. 7 is a timing diagram illustrating a method of generating test data according to some embodiments of the invention.

FIG. 7 is a timing diagram illustrating a method of generating test data according to some embodiments of the invention.

Referring to FIG. 7, an internal clock signal INT CLOCK is generated based on an external clock signal CLK and an inverted external clock signal CLKB.

After the test pattern data D0 and D1 are provided to the test data generator 130 based on a data strobe signal DS that is synchronized to the external clock signal CLK, the test data Din1, Din2, Din3 and Din4 are generated from the test data generator 130.

When the pattern selector (i.e., the CONTROL signal) is at the active level (inversion mode), the input test pattern data D0 is used to generate to the test data Din1 (D0) and Din2 (D0').

When the pattern selector (i.e., the CONTROL signal) is at the negative level (non-inversion mode), the input test pattern data D1 is used to generate the test data Din3 (D1) and Din4 (D1).

As a result, the input test pattern data D0 and D1 are used to generate the test data D0, D0', D1, D1. Alternatively, the input test pattern data D0 and D1 may be used to generate the test data D0, D0, D1, D1' by changing the logic level of the pattern selector i.e., the control signal.

During the memory test time, an unused signal may be utilized for the control signal instead of input of the control signal through the row address pin.

For example, during the memory test time of the semiconductor memory device 10, the data strobe signal is not used in a differential mode, but may be used in a single-end mode; thus, an inverted data strobe signal (DSB) may be used for the control signal.

In such case, the control signal generator 160 generates the inversion mode or the non-inversion mode based on the active level or the negative level of the data strobe signal (DS) to provide the generated inversion mode or the generated non-inversion mode to the test data generator 130.

FIG. 8 is a timing diagram illustrating a method of generating test data according to some other embodiments of the invention. In particular, the method illustrated in FIG. 8 uses the inverted signal DSB of the data strobe signal DS as the control signal.

Referring to FIG. 8, an internal clock signal INT CLOCK is generated based on an external clock signal CLK and an inverted signal of the external clock signal CLKB.

After the test pattern data D0 and D1 are input in response to the data strobe signal (DS) that is synchronized to the external signal CLK, the test data Din1, Din2, Din3 and Din4 are generated.

When the pattern selector DSB (i.e., the control signal) is at the negative level (non-inversion mode), the input test pattern data D0 is used to generate the test data Din1 (D0) and Din2 (D0).

When the pattern selector DSB (i.e., the control signal) is at the active level (inversion mode), the input test pattern data D1 is used to generate the test data Din3 (D1) and Din4 (D1').

As a result, the inputted test pattern data D0 and D1 are generated to the test data D0, D0, D1, D1'.

As described above, various test data may be generated using the control signal that is capable of generating the test data in real time.

The test device included in the semiconductor memory device 10 and the testing method using the same according to these exemplary embodiments of the invention may generate various test data suitable for a memory test at a high operating speed, using test pattern data that are inputted from the external test device 500, in response to a relatively low frequency external clock signal that is provided from the external test device 500.

Embodiments of the invention may be practiced in many ways. What follows are exemplary, non-limiting descriptions of some embodiments of the invention.

According to some embodiments, a test device included in a semiconductor memory device includes a clock frequency multiplier, a data input buffer, a test data generator, and a data output buffer. The clock frequency multiplier generates an internal clock signal having a relatively high frequency by multiplying an external clock signal having a relatively low frequency, in which the external clock is provided from an external test device. The data input buffer buffers test pattern data to output the buffered test pattern data, in which the test pattern data is provided from the external test device and synchronized to the external clock signal. The test data generator generates test data that are synchronized to the internal clock signal by using the outputted test pattern data, based on one of a first control signal and a second control signal. The first control signal is provided from the external device, and the second control signal being generated based on an internal setting data. The data output buffer synchronizes the generated test data to the internal clock signal, and outputs the synchronized test data to a memory core of the semiconductor memory device.

In an exemplary embodiment of the invention, the clock frequency multiplier may perform an exclusive-OR operation on the external clock signal and an inverted external clock signal to generate an internal clock signal having a relatively high frequency, and the inverted external clock signal has a phase difference of about 90 degrees with respect to the external clock signal.

In an exemplary embodiment of the invention, the clock frequency multiplier may generate the internal clock signal by using the external clock signal and by employing a phase-locked loop (PLL).

In an exemplary embodiment of the invention, the two test pattern data may be provided from the external test device during one cycle of the external clock signal, and the test data generator generates the four test data by using the two test pattern data provided from the external test device.

In an exemplary embodiment of the invention, the test device may further include a mode register that is configured to store the internal setting data used for performing a memory test of the semiconductor memory device, and that is configured to provide the second control signal used for generating the test data to the test data generator.

In an exemplary embodiment of the invention, the second control signal provided to the test data generator by the mode register may include a mode register set enable signal for activating a mode register set signal and a mode register set inversion signal for generating the test data in an inversion mode.

In an exemplary embodiment of the invention, the first control signal may be input through a row address pin of the semiconductor memory device, or the first control signal may include an inverted signal of a data strobe signal used for input of the test pattern data.

In an exemplary embodiment of the invention, the test device may further include a control signal generator configured to provide a control signal enable signal for activating input of the first control signal and an inversion control signal for generating the test data in an inversion mode to the test data generator.

In an exemplary embodiment of the invention, the control signal generator may generate the inversion mode when the first control signal is at an active level, and generates the non-inversion mode when the first control signal is at a negative level, and wherein the control signal generator provides the generated inversion mode or the generated non-inversion mode to the test data generator.

In an exemplary embodiment of the invention, the first control signal provided to the test data generator may include the control signal enable signal for providing the non-inversion mode and the inversion mode.

In an exemplary embodiment of the invention, the test data generator may include a first test data generator configured to receive the test pattern data 'D0' and the control signal enable signal to output the test data 'Din 1;' a second test data generator configured to receive the test pattern data 'D0,' the control signal enable signal, and the inversion control signal to output the test data 'Din2; ' a third test data generator configured to receive the test pattern data 'D1' and the control signal enable signal to output the test data 'Din3; 'and a fourth test data generator configured to receive the test pattern data 'D1, 'the control signal enable signal, and the inversion control signal to output the test data 'Din4.'

In an exemplary embodiment of the invention, the first test data generator may include a first inverter configured to invert the test pattern data 'D0 ;' a second inverter configured to invert an output of the first inverter; a first NAND gate configured to perform a NAND operation on an output of the second inverter and an inverted signal of the control signal enable signal; a second NAND gate configured to perform a NAND operation on the test pattern data 'D0' and the control signal enable signal; and a third NAND gate configured to perform a NAND operation on an output of the first NAND gate and an output of the second NAND gate to output the test data 'Din 1.'

In an exemplary embodiment of the invention, the second test data generator may include a third inverter configured to invert the test pattern data 'D0;' a fourth inverter configured to invert an output of the third inverter; a fourth NAND gate configured to perform a NAND operation on an output of the fourth inverter and the inverted signal of the control signal enable signal; a fifth NAND gate configured to perform a NAND operation on the output of the second inverter and the control signal enable signal; a sixth NAND gate configured to perform a NAND operation on the output of the first inverter and the inversion control signal; and a seventh NAND gate configured to perform a NAND operation on an output of the fifth NAND gate and an output of the sixth NAND gate to output the test data 'Din2.'

In other embodiments of the invention, a method of testing a semiconductor memory device includes generating an internal clock signal having a relatively high frequency by multiplying an external clock signal having a relatively low frequency, where the external clock signal is provided from an external test device. The method further includes generating test data that are to be synchronized to the internal clock signal by using test pattern data based on one of a first control signal and a second control signal, in which the first control signal is provided from an external device, the second control signal is generated based on internal setting data, and the test pattern data is provided from the external test device and synchronized to the external clock signal. Furthermore, the method also includes providing the test data synchronized to the internal clock signal to a memory core of the semiconductor memory device.

In other embodiments of the invention, generating the test data may include outputting the test pattern data by buffering the provided test pattern data, and generating the test data by using the outputted test pattern data based on one of the first control data and the second control data.

While exemplary embodiments of the invention and some of their advantages were described in detail above, it should be understood that various changes, substitutions and alterations may be made to those exemplary embodiments without departing from the inventive principles that they contain, and which are defined by the attached claims.

The invention claimed is:

1. A test device for a semiconductor memory device, the test device comprising:
   a clock frequency multiplier configured to generate an internal clock signal having a frequency higher than an external clock signal received from an external test device;
   a data input buffer configured to buffer test pattern data that is provided from the external test device and that is synchronized to the external clock signal, the data input buffer further configured to output the buffered test pattern data;
   a test data generator configured to generate test data responsive to the buffered test pattern data and one of a first control signal and a second control signal, the first control signal provided by the external test device, the second control signal generated in response to an internal setting data; and
   a data output buffer configured to synchronize the test data to the internal clock signal and configured to output the synchronized test data to a memory core of the semiconductor memory device.

2. The test device of claim 1, the clock frequency multiplier configured to perform an exclusive-OR operation on the external clock signal and an inverted external clock signal to generate the internal clock signal, the inverted external clock signal having a phase difference of about 90 degrees with respect to the external clock signal.

3. The test device of claim 1, the clock frequency multiplier configured to generate the internal clock signal using the external clock signal and a phase-locked loop (PLL).

4. The test device of claim 1, the internal clock signal having a frequency that is about two times greater than a frequency of the external clock signal.

5. The test device of claim 1, the data input buffer configured to receive two test pattern data from the external test device during one cycle of the external clock signal.

6. The test device of claim 5, the test data generator configured to generate four test data by using the two test pattern data.

7. The test device of claim 6, the two test pattern data corresponding to D0 and D1.

8. The test device of claim 7, the four test data selected from the group consisting of (D0, D0, D1, D1), (D0, D0', D1, D1'), (D0, D0', D1, D1) and (D0, D0, D1, D1').

9. The test device of claim 1, further comprising a mode register configured to store the internal setting data and to generate the second control signal that is provided to the test data generator.

10. The test device of claim 9, the second control signal comprising:
    a mode register set enable signal configured to activate a mode register set signal, and to enable the generation of the test data during a non-inversion mode; and
    a mode register set inversion signal configured to enable the generation of the test data during an inversion mode.

11. The test device of claim 1, a row address pin of the semiconductor memory device configured to receive the first control signal from the external test device.

12. The test device of claim 1, the first control signal comprising an inverted version of a data strobe signal, the data strobe signal used for input of the test pattern data.

13. The test device of claim 1, further comprising a control signal generator configured to provide:
   an inversion control signal; and
   a control signal enable signal as the first control signal for generating the test data in one of a non-inversion mode and an inversion mode.

14. The test device of claim 13, the test data generator comprising:
   a first test data generator configured to output a first test data in response to a first test pattern data and the control signal enable signal;
   a second test data generator configured to output a second test data in response to the first test pattern data, the control signal enable signal, and the inversion control signal;
   a third test data generator configured to output a third test data in response to a second test pattern data and the control signal enable signal;
   a fourth test data generator configured to output a fourth test data in response to the second test pattern data, the control signal enable signal and the inversion control signal.

15. The test device of claim 14, the first test data generator comprising:
   a first inverter configured to invert the first test pattern data;
   a second inverter configured to invert an output of the first inverter;
   a first NAND gate configured to perform a NAND operation on an output of the second inverter and an inverted version of the control signal enable signal;
   a second NAND gate configured to perform a NAND operation on the first test pattern data and the control signal enable signal; and
   a third NAND gate configured to perform a NAND operation on an output of the first NAND gate and an output of the second NAND gate to output the first test data.

16. The test device of claim 15, the second test data generator comprising:
   a third inverter configured to invert the first test pattern data;
   a fourth inverter configured to invert an output of the third inverter;
   a fourth NAND gate configured to perform a NAND operation on an output of the fourth inverter and the inverted version of the control signal enable signal;
   a fifth NAND gate configured to perform a NAND operation on the output of the second inverter and the control signal enable signal;
   a sixth NAND gate configured to perform a NAND operation on the output of the first inverter and the inversion control signal; and
   a seventh NAND gate configured to perform a NAND operation on an output of the fifth NAND gate and an output of the sixth NAND gate to output the second test data.

17. The test device of claim 14, the third test data generator having an identical circuit configuration to that of the first test data generator, the fourth test data generator having an identical circuit configuration to that of the second test data generator.

18. A method of testing a semiconductor memory device, the method comprising:
   generating an internal clock signal by multiplying an external clock signal that is provided from an external test device, the internal clock signal having a higher frequency than the external clock signal;
   generating test data that are synchronized to the internal clock signal in response to test pattern data that are provided from the external test device and that are synchronized with the external clock signal, and in response to one of a first control signal provided from an external device and a second control signal that is generated based on an internal setting data; and
   providing the test data to a memory core of the semiconductor memory device.

19. The testing method of claim 18, wherein generating the test data comprises buffering the test pattern data.

20. The testing method of claim 18, wherein generating the internal clock signal comprises performing an exclusive-OR operation on the external clock signal and an inverted external clock signal to generate the internal clock signal, the inverted external clock signal having a phase difference of about 90 degrees with respect to the external clock signal.

21. The testing method of claim 18, wherein a frequency of the internal clock signal is two times greater than a frequency of the external clock signal.

22. The testing method of claim 18, wherein generating test data comprises providing two test pattern data from the external test device during one cycle of the external clock signal.

23. The testing method of claim 22, wherein generating test data further comprises generating four test data in response to the two test pattern data.

24. The testing method of claim 23, wherein the two test pattern data consist of D0 and D1.

25. The testing method of claim 24, wherein the four test data is selected from the group consisting of (D0, D0, D1, D1), (D0, D0', D1, D1'), (D0, D0', D1, D1) and (D0, D0, D1, D1').

26. The testing method of claim 18, wherein the internal setting data is set by a mode register.

27. The testing method of claim 26, wherein the second control signal comprises:
   a mode register set enable signal for activating a mode register set signal, and for generating the test data in a non-inversion mode; and
   a mode register set inversion signal for generating the test data in an inversion mode.

28. The testing method of claim 18, wherein the first control signal is input through a row address pin of the semiconductor memory device.

29. The testing method of claim 18, wherein the first control signal comprises an inverted signal of a data strobe signal, the data strobe signal used to input the test pattern data.

30. The testing method of claim 18, wherein generating the test data further comprises providing:
   a control signal enable signal as the first control signal, for generating the test data in one of a non-inversion mode and an inversion mode; and
   an inversion control signal.

31. A test device for a semiconductor memory device, the test device comprising:
   a clock frequency multiplier configured to generate an internal clock signal having a frequency higher than an external clock signal received from an external test device;
   a data input buffer configured to buffer test pattern data that is provided from the external test device and that is synchronized to the external clock signal, the data input buffer further configured to output the buffered test pattern data;
   a test data generator configured to generate test data responsive to the buffered test pattern data and one of a first control signal and a second control signal, the first control signal provided by the external test device, the second control signal generated in response to an internal setting data, the test data generator comprising:
a first inverter configured to invert the test pattern data;
a second inverter configured to invert an output of the first inverter; and
a first NAND gate configured to perform a NAND operation on an output of the second inverter and an inverted version of the first control signal; and
a data output buffer configured to synchronize the test data to the internal clock signal and configured to output the synchronized test data to a memory core of the semiconductor memory device.

32. The test device of claim 31, the test data generator further comprising:
a second NAND gate configured to perform a NAND operation on the test pattern data and the first control signal; and
a third NAND gate configured to perform a NAND operation on an output of the first NAND gate and an output of the second NAND gate to output the test data.

\* \* \* \* \*